(12) United States Patent
Gaska et al.

(10) Patent No.: US 9,184,339 B2
(45) Date of Patent: Nov. 10, 2015

(54) DEEP ULTRAVIOLET LIGHT EMITTING DIODE

(71) Applicant: Sensor Electronic Technology, Inc., Columbia, SC (US)

(72) Inventors: Remigijus Gaska, Columbia, SC (US); Maxim S Shatalov, Columbia, SC (US); Michael Shur, Latham, NY (US); Alexander Dobrinsky, Loudonville, NY (US)

(73) Assignee: Sensor Electronic Technology, Inc., Columbia, SC (US)

(*) Notice: Subject to any disclaimer, the term of this patent is extended or adjusted under 35 U.S.C. 154(b) by 0 days.

(21) Appl. No.: 14/514,586

(22) Filed: Oct. 15, 2014

(65) Prior Publication Data

US 2015/0064822 A1    Mar. 5, 2015

Related U.S. Application Data

(63) Continuation of application No. 13/803,681, filed on Mar. 14, 2013, now Pat. No. 8,927,959, which is a continuation-in-part of application No. 13/161,961, filed on Jun. 16, 2011, now Pat. No. 8,907,322.

(60) Provisional application No. 61/610,671, filed on Mar. 14, 2012, provisional application No. 61/356,484, filed on Jun. 18, 2010.

(51) Int. Cl.
*H01L 33/00* (2010.01)
*H01L 33/32* (2010.01)
(Continued)

(52) U.S. Cl.
CPC ........ *H01L 33/0075* (2013.01); *G06F 17/5068* (2013.01); *H01L 33/0025* (2013.01);
(Continued)

(58) Field of Classification Search
CPC .................. H01L 33/06; H01L 33/04; H01L 2924/12041; H01L 33/24; H01L 33/32; H01L 33/10; H01L 33/0025; H01L 33/0075; H01L 33/22; H01L 33/385; H01L 33/405; H01L 2933/0058; G06F 17/5068
See application file for complete search history.

(56) References Cited

U.S. PATENT DOCUMENTS

| | | | |
|---|---|---|---|
| 5,012,302 | A | 4/1991 | Goronkin |
| 5,592,501 | A | 1/1997 | Edmond et al. |

(Continued)

FOREIGN PATENT DOCUMENTS

| | | | |
|---|---|---|---|
| JP | 02211686 A2 | 8/1990 | |
| JP | 11121870 A2 | 4/1999 | |

(Continued)

OTHER PUBLICATIONS

English Translation of Office Action for Chinese Application No. 201180037699.3, dated Jan. 5, 2015, 8 pages.

(Continued)

*Primary Examiner* — Roy Potter
(74) *Attorney, Agent, or Firm* — LaBatt, LLC

(57) ABSTRACT

A method of fabricating a light emitting diode, which includes an n-type contact layer and a light generating structure adjacent to the n-type contact layer, is provided. The light generating structure includes a set of quantum wells. The contact layer and light generating structure can be configured so that a difference between an energy of the n-type contact layer and an electron ground state energy of a quantum well is greater than an energy of a polar optical phonon in a material of the light generating structure. Additionally, the light generating structure can be configured so that its width is comparable to a mean free path for emission of a polar optical phonon by an electron injected into the light generating structure.

27 Claims, 13 Drawing Sheets

(51) Int. Cl.

| | | |
|---|---|---|
| *H01L 33/04* | (2010.01) | |
| *H01L 33/06* | (2010.01) | |
| *H01L 33/10* | (2010.01) | |
| *G06F 17/50* | (2006.01) | |
| H01L 33/22 | (2010.01) | |
| H01L 33/38 | (2010.01) | |
| H01L 33/40 | (2010.01) | |

(52) U.S. Cl.
CPC ............... *H01L33/04* (2013.01); *H01L 33/06* (2013.01); *H01L 33/10* (2013.01); *H01L 33/32* (2013.01); *H01L 33/22* (2013.01); *H01L 33/385* (2013.01); *H01L 33/405* (2013.01); *H01L 2933/0058* (2013.01)

(56) References Cited

U.S. PATENT DOCUMENTS

| | | | |
|---|---|---|---|
| 5,727,010 | A | 3/1998 | Capasso et al. |
| 5,877,509 | A | 3/1999 | Pau et al. |
| 5,917,195 | A | 6/1999 | Brown |
| 6,277,696 | B1 | 8/2001 | Carey et al. |
| 6,829,269 | B2 | 12/2004 | Goodhue et al. |
| 6,943,377 | B2 | 9/2005 | Gaska et al. |
| 6,946,788 | B2 | 9/2005 | Suehiro et al. |
| 7,326,963 | B2 | 2/2008 | Gaska et al. |
| 7,554,123 | B2 | 6/2009 | Gaska et al. |
| 7,619,238 | B2 | 11/2009 | Gaska et al. |
| 8,455,894 | B1 | 6/2013 | D'Evelyn et al. |
| 2004/0099869 | A1 | 5/2004 | Gaska et al. |
| 2004/0104395 | A1 | 6/2004 | Hagimoto et al. |
| 2004/0195579 | A1 | 10/2004 | Sonobe |
| 2005/0236642 | A1 | 10/2005 | Sakai et al. |
| 2006/0118820 | A1 | 6/2006 | Gaska et al. |
| 2007/0151755 | A1 | 7/2007 | Bilenko et al. |
| 2007/0181869 | A1 | 8/2007 | Gaska et al. |
| 2008/0273565 | A1 | 11/2008 | Gmachl et al. |
| 2008/0283818 | A1 | 11/2008 | Odnoblyudov et al. |
| 2009/0026440 | A1 | 1/2009 | Kyono et al. |
| 2009/0114943 | A1 | 5/2009 | Fujikura |
| 2009/0127572 | A1 | 5/2009 | Tanaka et al. |
| 2010/0200839 | A1 | 8/2010 | Okai et al. |
| 2011/0266520 | A1 | 11/2011 | Shur et al. |
| 2011/0309326 | A1 | 12/2011 | Gaska et al. |
| 2012/0248458 | A1 | 10/2012 | Cho et al. |
| 2012/0301816 | A1 | 11/2012 | Lee |

FOREIGN PATENT DOCUMENTS

| | | |
|---|---|---|
| JP | 2003-282862 | 10/2003 |
| JP | 2004-006991 | 1/2004 |
| JP | 2004207508 | 7/2004 |
| JP | 2006-093624 | 4/2006 |
| JP | 2007-103690 | 4/2007 |
| JP | 2007-273975 | 10/2007 |
| JP | 2009-135441 | 6/2009 |
| JP | 2009-147071 | 7/2009 |
| JP | 2009-267263 | 11/2009 |
| JP | 2010-153793 | 7/2010 |
| JP | 2012-246215 | 12/2012 |
| JP | 2004179206 A2 | 6/2014 |
| KR | 1020050026473 | 3/2005 |
| WO | 2008/128726 | 10/2008 |
| WO | 2011/055462 | 5/2011 |

OTHER PUBLICATIONS

Saxler, A. et al., "Aluminum gallium nitride short-period superlattices doped with magnesium," Applied Physics Letters, vol. 74, No. 14, Apr. 5, 1999, pp. 2023-2025.

Peng, H. et al., "Ultraviolet light-emitting diodes operating in the 340 nm wavelength range and application to timeresolved fluorescence spectroscopy," Applied Physics Letters, vol. 85, No. 8, Aug. 23, 2004, pp. 1436-1438.

Goepfert, I.D. et al., "Experimental and theoretical study of acceptor activation and transport properties in p-type $Al_xGa_{1-x}N/GaN$ superlattices," Journal of Applied Physics, vol. 88, No. 4, Aug. 15, 2000, pp. 2030-2038.

Wang, T. et al., "1 mW AllnGaN-based ultraviolet light-emitting diode with an emission wavelength of 348 nm grown on sapphire substrate," Applied Physics Letters, vol. 81, No. 14, Sep. 30, 2002, pp. 2508-2510.

Nishida, Toshio et al., "Efficient and high-power AlGaN-based ultraviolet light-emitting diode grown on bulk GaN," Applied Physics Letters, vol. 79, No. 6, Aug. 6, 2001, pp. 711-712.

Kozodoy, Peter et al., "Polarization-enhanced Mg doping of AlGaN/GaN superlattices," Applied Physics Letters, vol. 75, No. 16, Oct. 18, 1999, pp. 2444-2446.

Shur, M.S. et al., "Accumulation hole layer in p-GaN/AlGaN heterostructures," Applied Physics Letters, vol. 76, No. 21, May 22, 2000, pp. 3061-3063.

Zhang, J.P. et al., "Milliwatt power deep ultraviolet light-emitting diodes over sapphire with emission at 278 nm," Applied Physics Letters, vol. 81, No. 26, Dec. 23, 2002, pp. 4910-4912.

Zhang, J.P. et al., "AlGaN multiple-quantum-well-based, deep ultraviolet light-emitting diodes with significantly reduced long-wave emission," Applied Physics Letters, vol. 83, No. 17, Oct. 27, 2003, pp. 3456-3458.

Chitnis, A. et al., "Improved performance of 325-nm emission AlGaN ultraviolet light-emitting diodes," Applied Physics Letters, vol. 82, No. 16, Apr. 21, 2003, pp. 2565-2567.

Sun, W.H. et al., "AlGaN-based 280 nm light-emitting diodes with continuous wave powers in excess of 1.5 mW," Applied Physics Letters, vol. 85, No. 4, Jul. 26, 2004, pp. 531-533.

Adivarahan, V. et al., "High-efficiency 269 nm emission deep ultraviolet light-emitting diodes," Applied Physics Letters, vol. 84, No. 23, Jun. 7, 2004, pp. 4762-4764.

Yasan, A. et al., "4.5 mW operation of AlGaN-based 267 nm deep-ultraviolet light-emitting diodes," Applied Physics Letters, vol. 83, No. 23, Dec. 8, 2003, pp. 4701-4703.

Fischer, A.J. et al., "Room-temperature direct current operation of 290 nm light-emitting diodes with milliwatt power levels," Applied Physics Letters, vol. 84, No. 17, Apr. 26, 2004, pp. 3394-3396.

Tamulaitis, G. et al., "Dislocation-limited Lifetime of Nonequilibrium Carriers in AlGaN Epilayers," Proceedings of ICPS-27 (2004), pp. 1-2.

Kamiyama, S. et al., "Heteroepitaxial technology for high-efficiency UV light-emitting diode," Opto-Electronics Review, 10, No. 4, 2002, pp. 225-230.

Zhang, J.P. et al., "AlGaN Based 280 nm Light Emitting Diodes with Continuous-Wave Power Exceeding 1 mW at 25 mA," Applied Physics Letters, vol. 85, No. 23, Dec. 2004, p. 5532 (pp. 1-11).

Olesberg et al., "Mid-infrared InAs/GainSb separate confinement heterostructure laser diode structures," Mar. 15, 2001, pp. 3283-3289, Journal of Applied Physics, vol. 89 No. 6.

Paulavicius et al., "Hot-optical-phonon effects on electron relaxation in an AlGaAs/GaAs quantum cascade laser structure," Oct. 1, 1998, pp. 3459-3466, Journal of Applied Physics, vol. 84 No. 7.

PCT International Search Report and Written Opinion of the ISA for International Application No. PCT/US2006/060464, Apr. 30, 2008.

Shur et al., "Deep-Ultraviolet Light-Emitting Diodes", IEEE Transactions on Electron Devices, vol. 57, No. 1, Jan. 2010, pp. 12-25.

Shatalov et al., "Efficiency of Light Emission in High Aluminum Content AlGaN Quantum Wells", Journal of Applied Physics 105, 073103, (2009), pp. 1-6.

Park, International Application No. PCT/US2011/040850, Written Opinion of the International Searching Authority, Feb. 9, 2012, 9 pages.

Park, International Search Report and Written Opinion for International Application No. PCT/US2013/031267, Jun. 27, 2013, 11 pages.

Daly et al. Optical pump-and probe measurement of the thermal conductivity of nitride thin films. Journal of Applied Physics, vol. 92, No. 7, 2002, pp. 3820-3824.

(56) References Cited

OTHER PUBLICATIONS

Carrano et al. Improved Ultraviolet Quantum Efficiency Using a Transparent Recessed Window AlGaN/GaN Heterojunction p-i-n. Photodiodel EDM 99-587, 11999, pp. 23.2.123.2.4.
Khan et al. Japanese Journal of Applied Physics, vol. 44, No. 9 10, 2005, pp. 7191-7206.
Sze. Semiconductor Devices. Physics and Technology, 2nd Edition, p. 536.
Ghosh et al. Widely transparent electrodes based on ultrathin metals. Optics Letters, 2009, vol. 34, No. 3, pp. 325-327.
Wanunu et al. Widely-applicable Gold Substrate for the Study of Ultrathin Overlayers. JACS, 2004, 126, pp. 5569-5576.
Yushina. Office Action for U.S. Appl. No. 13/161,961, Nov. 13, 2013, 43 pages.
Office Action for Korean Application No. 10-2013-7001471, dated Feb. 10, 2014, 8 pages. (English Translation included).
Toshihiko Satoh, English Language Translation of Office Action for Japanese Patent Application No. P2013-515541, Mar. 4, 2014, 13 pages.
Piprek, Nitride Semiconductor Devices: Principles and Simulation, Introduction, 2007, pp. 3-11.
Kim, KIPO Decision of Refusal for Application No. 10-2013-7001471, Jun. 21, 2014, 6 pages. (English Translation included).
Yushina, USPTO Final Office Action for U.S. Appl. No. 13/161,961, May 28, 2014, 28 pages.
Yushina, USPTO Notice of Allowance for U.S. Appl. No. 13/161,961, Aug. 7, 2014, 17 pages.
Satoh Toshihiko, Office Action for Japanese Patent Application No. P2013-515541 with English Language Translation, Sep. 2, 2014, 7 pages.
Potter, USPTO Office Action for U.S. Appl. No. 13/803,681, Jun. 6, 2014, 32 pages.
Potter, USPTO Notice of Allowance for U.S. Appl. No. 13/803,681, Sep. 3, 2014, 17 pages.

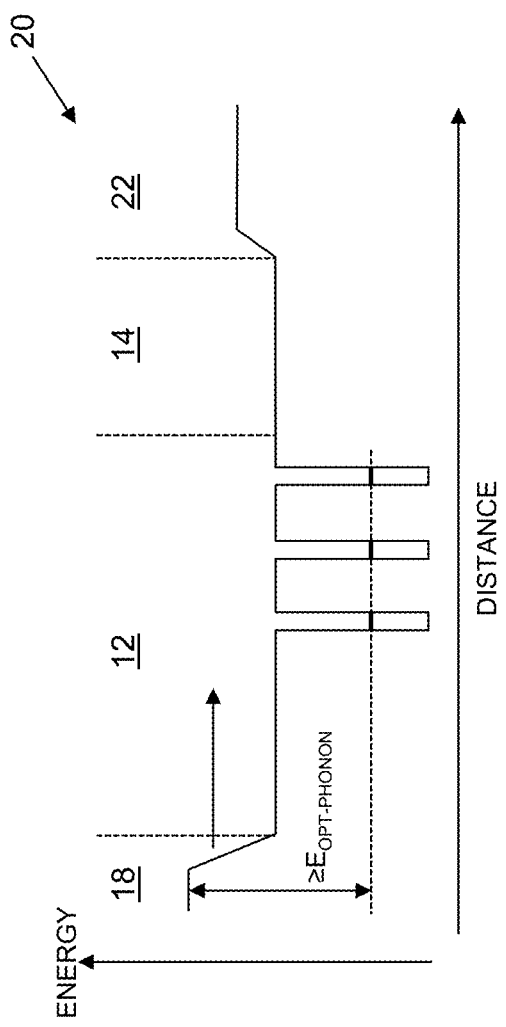

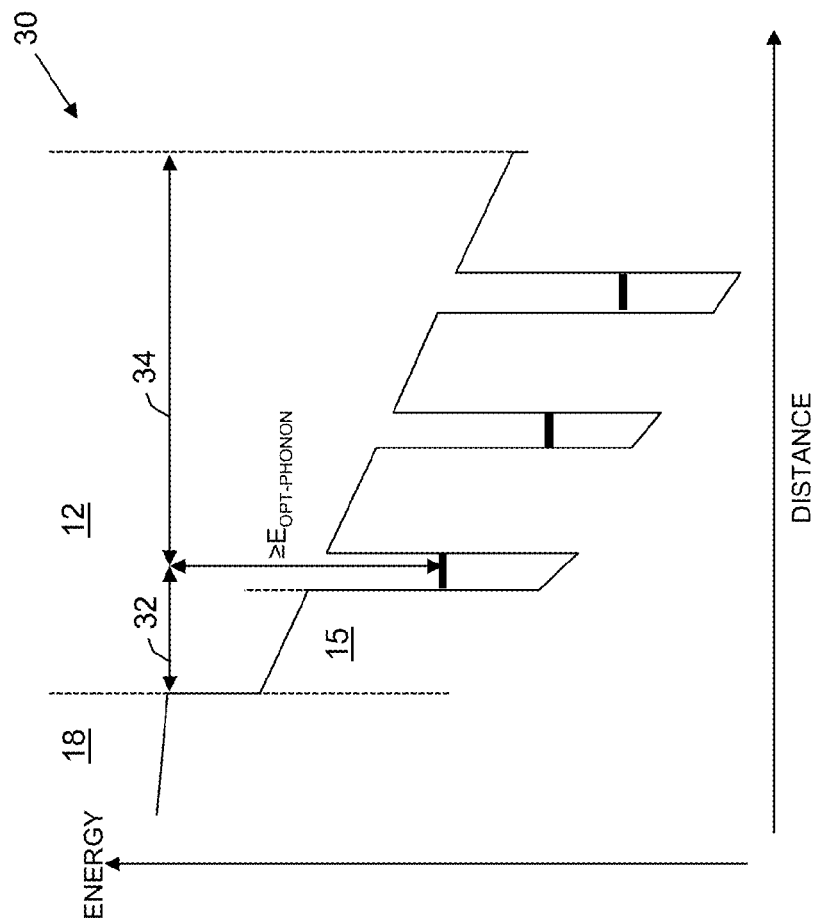

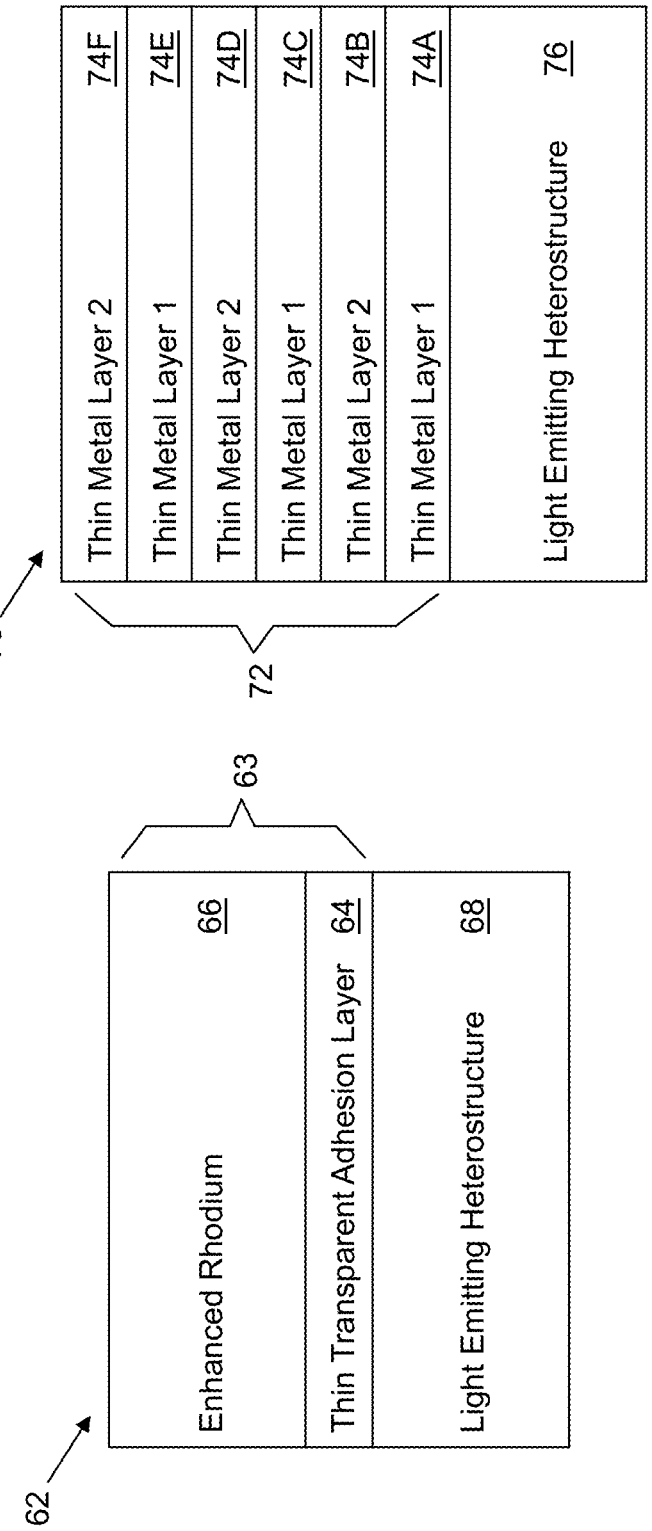

DEEP ULTRAVIOLET LIGHT EMITTING DIODE

REFERENCE TO PRIOR APPLICATIONS

The current application is a continuation of U.S. Utility application No. 13/803,681, titled "Deep Ultraviolet Light Emitting Diode," which was filed on 14 Mar. 2013, which claims the benefit of U.S. Provisional Application No. 61/610,671, which was filed on 14 Mar. 2012, and which is a continuation-in-part of U.S. Utility application No. 13/161,961, titled "Deep Ultraviolet Light Emitting Diode," which was filed on 16 Jun. 2011, which claims the benefit of U.S. Provisional Application No. 61/356,484, titled "Deep ultraviolet diode," which was filed on 18 Jun. 2010, all of which are hereby incorporated by reference.

GOVERNMENT LICENSE RIGHTS

The U.S. Government has a paid-up license in this invention and the right in limited circumstances to require the patent owner to license others on reasonable terms as provided for by the terms of SBIR Phase II Grant No. IIP-0956746 awarded by the National Science Foundation.

TECHNICAL FIELD

The disclosure relates generally to nitride-based heterostructures, and more particularly, to an improved ultraviolet light emitting nitride-based heterostructure.

BACKGROUND ART

Emerging deep ultraviolet light emitting diodes (DUV LEDs) cover the ultraviolet (UV) range down to 210 nanometers (nm), and provide output powers already sufficient for many applications. Additionally, these devices have high modulation frequencies, low noise, flexible form factor and spectral and space power distribution, high internal quantum efficiency, and a potential to achieve high wall plug efficiency. For example, photoluminescence (PL) studies and ray tracing calculations show that the achieved internal quantum efficiency for a 280 nm DUV LED may be quite high, e.g., between fifteen and seventy percent.

However, external quantum efficiency and wall plug efficiency of typical DUV LEDs is below three percent, with the highest efficiencies for 280 nm LEDs and lower efficiencies for LEDs emitting ultraviolet light having shorter wavelengths. Some reasons for the lower external and wall plug efficiencies include very low light extraction efficiency due to internal reflection from the sapphire substrate and sapphire/air interface, and strong absorption in the top low aluminum (AD-content p-type aluminum gallium nitride (AlGaN) and p-type gallium nitride (GaN) layers. The efficiency of the LEDs is further reduced at higher currents and/or generated powers.

In UV LEDs emitting ultraviolet light having a shorter wavelength, the internal quantum efficiency also drops due to materials problems resulting from growth of AlGaN structures with high Al content. Such growth, among other things, is complicated by the low mobility of Al adatoms, which can result in inhomogeneous Al composition and lateral phase separation, as well as high density of threading dislocations and point defects.

SUMMARY OF THE INVENTION

Aspects of the invention provide a method of fabricating a light emitting diode, which includes an n-type contact layer and a light generating structure adjacent to the n-type contact layer. The light generating structure includes a set of quantum wells. The contact layer and light generating structure can be configured so that a difference between an energy of the n-type contact layer and an electron ground state energy of a quantum well is greater than an energy of a polar optical phonon in a material of the light generating structure. Additionally, the light generating structure can be configured so that its width is comparable to a mean free path for emission of a polar optical phonon by an electron injected into the light generating structure. The diode can include a blocking layer, which is configured so that a difference between an energy of the blocking layer and the electron ground state energy of a quantum well is greater than the energy of the polar optical phonon in the material of the light generating structure. The diode can include a composite contact, including an adhesion layer, which is at least partially transparent to light generated by the light generating structure and a reflecting metal layer configured to reflect at least a portion of the light generated by the light generating structure.

A first aspect of the invention provides a method of fabricating a light emitting heterostructure, the method comprising: creating a design for the light emitting heterostructure based on a set of attributes of a polar optical phonon, wherein the light emitting heterostructure includes an n-type contact layer and a light generating structure including a plurality of quantum wells and having a first side adjacent to the n-type contact layer, and wherein the creating includes: selecting materials for the n-type contact layer and a quantum well in the plurality of quantum wells based on an energy of the polar optical phonon in a material of the light generating structure, wherein a difference between a conduction band edge energy of the n-type contact layer and an electron ground state energy of the quantum well is greater than the energy of the polar optical phonon; and selecting a target width of the light generating structure based on a mean free path for emission of a polar optical phonon by an electron injected into the light generating structure, wherein the target width is comparable to the mean free path; and fabricating the light emitting heterostructure according to the design.

A second aspect of the invention provides a method of fabricating a light emitting heterostructure, the method comprising: creating a design for the light emitting heterostructure based on a set of attributes of a polar optical phonon, wherein the light emitting heterostructure includes an n-type contact layer, a light generating structure including a plurality of quantum wells and having a first side adjacent to the n-type contact layer, and a blocking layer located on a second side of the light generating structure opposite the first side, and wherein the creating includes: selecting materials for the blocking layer and a quantum well in the plurality of quantum wells based on an energy of the polar optical phonon in a material of the light generating structure, wherein a difference between a conduction band edge energy of the blocking layer and an electron ground state energy of the quantum well is greater than the energy of the polar optical phonon; and selecting a target width of the light generating structure based on a mean free path for emission of a polar optical phonon by an electron injected into the light generating structure, wherein the target width is comparable to the mean free path; and fabricating the light emitting heterostructure according to the design.

A third aspect of the invention provides a method of fabricating a light emitting device, the method comprising: forming an n-type contact layer; forming a light generating structure having a first side adjacent to the n-type contact layer, the light generating structure including: a set of quantum wells, wherein a difference between a conduction band edge energy of the n-type contact layer and an electron ground state energy of a quantum well in the set of quantum wells is greater than an energy of a polar optical phonon in a material of the light generating structure; and a set of barriers interlaced with set of quantum wells, the set of barriers including a first barrier immediately adjacent to a first quantum well in the set of quantum wells and the first side of the light generating structure, wherein a thickness of the first barrier is sufficient to accelerate an injected electron in an electric field to reach the energy of the polar optical phonon with respect to the electron ground state energy in the first quantum well, and wherein a thickness of a remainder of the light generating structure exceeds a mean free path for emission of a polar optical phonon by an electron injected into the light generating structure.

Additional aspects of the invention provide methods of designing and/or fabricating the heterostructures and devices shown and described herein, as well as methods of designing and/or fabricating circuits including such devices, and the resulting circuits. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3 shows a band diagram for an illustrative light emitting heterostructure according to another embodiment.

FIG. 4 shows a band diagram for an illustrative light emitting heterostructure according to yet another embodiment.

FIGS. 8A-8D show illustrative LED configurations with composite contacts according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a light emitting diode, which includes an n-type contact layer and a light generating structure adjacent to the n-type contact layer. The light generating structure includes a set of quantum wells. The contact layer and light generating structure can be configured so that a difference between an energy of the n-type contact layer and an electron ground state energy of a quantum well is greater than an energy of a polar optical phonon in a material of the light generating structure. Additionally, the light generating structure can be configured so that its width is comparable to a mean free path for emission of a polar optical phonon by an electron injected into the light generating structure. The diode can include a blocking layer, which is configured so that a difference between an energy of the blocking layer and the electron ground state energy of a quantum well is greater than the energy of the polar optical phonon in the material of the light generating structure. The diode can include a composite contact, including an adhesion layer, which is at least partially transparent to light generated by the light generating structure and a reflecting metal layer configured to reflect at least a portion of the light generated by the light generating structure. As used herein, unless otherwise noted, the term "set" means one or more (i.e., at least one) and the phrase "any solution" means any now known or later developed solution. Furthermore, as used herein, it is understood that the term "light" includes electromagnetic radiation of any wavelength, whether within the visible spectrum or outside of the visible spectrum.

Figure 1:
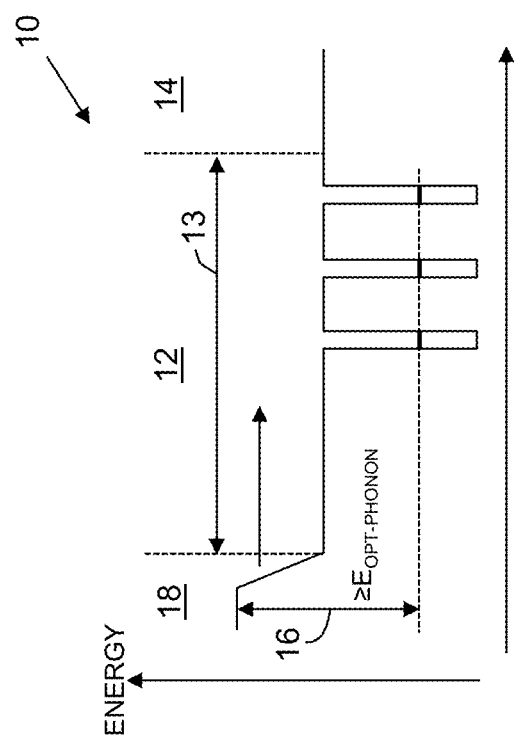
FIG. 1 shows an illustrative band diagram of a deep UV light emitting heterostructure including an energy tub according to a previous solution.

Turning to the drawings, FIG. 1 shows an illustrative band diagram of a deep UV light emitting heterostructure 2 including an energy tub 4 according to a previous solution. In particular, a light generating multiple quantum well (MQW) structure 6 of the heterostructure 2 is confined to the energy tub 4. However, the inventors have found that such a band diagram can be difficult to implement for short wavelength structures, in which the Al molar fraction is very high, e.g., greater than fifty percent.

Figure 2:
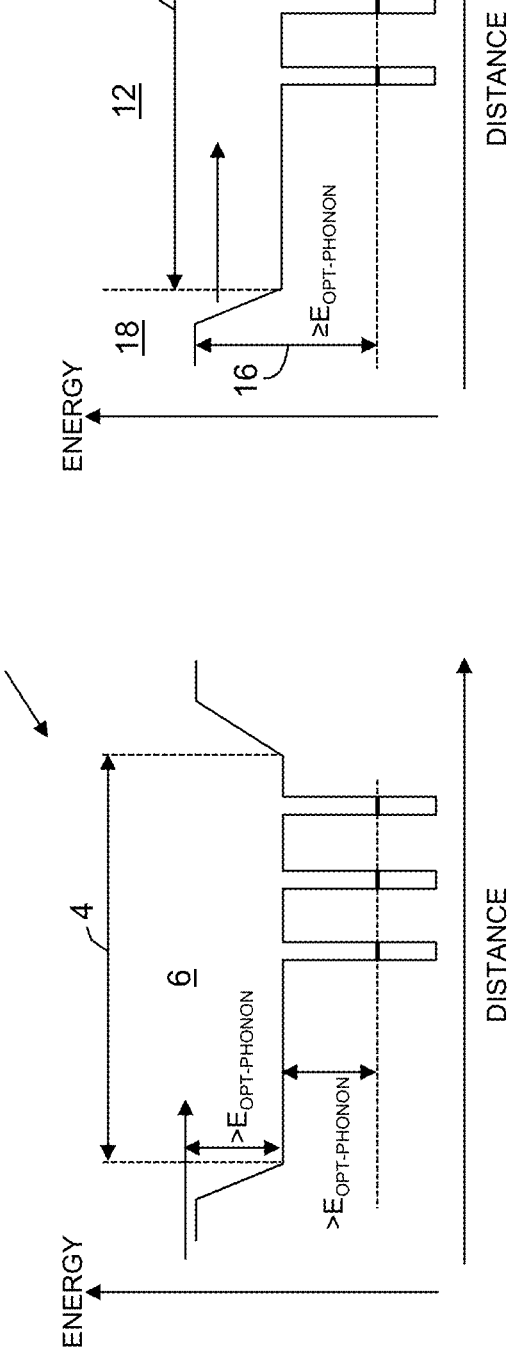
FIG. 2 shows a band diagram of an illustrative light emitting heterostructure according to an embodiment.

FIG. 2 shows a band diagram of an illustrative light emitting heterostructure 10 according to an embodiment. In this case, the heterostructure 10 includes a light generating structure 12 and an at least partially transparent (e.g., semi-transparent or transparent) injector cladding layer 14 adjacent to the light generating structure 12. As illustrated, the light generating structure 12 can include interlaced sets of barriers (higher energy in the band diagram) and quantum wells (lower energy in the band diagram). To this extent, each quantum well in the light generating structure 12 has one or more adjacent barriers and each barrier in the light generating structure 12 has one or more adjacent quantum wells. In heterostructure 10, an energy difference 16 (e.g., band offset) between an energy of an n-type contact layer 18 and an electron ground state energy level in a quantum well in the light generating structure 12 is slightly larger than the energy of a polar optical phonon, $E_{OPT-PHONON}$, within a material of the light generating structure 12. In an embodiment, the energy difference 16 exceeds the energy of the polar optical phonon by approximately thermal energy, which is approximately twenty-six milli-electron Volts (meV) at room temperature.

Furthermore, a total width 13 of the light generating structure 12 can be selected to be comparable to a mean free path for emission of a polar optical phonon by an electron injected into the light generating structure 12. In an embodiment, the width 13 of the light generating structure 12 is configured to be slightly larger than the mean free path, e.g., exceeding the mean free path by less than approximately ten percent. In an embodiment, the width 13 of the light generating structure exceeds the mean free path by less than approximately five percent. However, it is understood that in other embodiments, the width 13 of the light generating structure can exceed the mean free path for emission of the polar optical phonon by greater than ten percent. The illustrative design of heterostructure 10 can achieve one or more of: enhanced transitions of the injected electrons into multiple quantum wells; confinement of the injected electrons in the quantum wells; and improved uniformity of the electron distribution between the multiple quantum wells.

The various layers of heterostructure 10 can be formed using any appropriate material compositions. In an illustrative embodiment, the layers 12, 14, 18 are formed using differing wide band gap semiconductor materials, such as differing group III nitride material compositions. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements. In an embodiment, the materials include any combination of: AlN, GaN, InN, and/or BN alloys.

In an embodiment, cladding layer 14 comprises an at least partially transparent magnesium (Mg)-doped AlGaN/AlGaN short period superlattice structure (SPSL). In another embodiment, the n-type contact layer 18 comprises a cladding layer formed of a short period superlattice, such as an AlGaN SPSL, which is at least partially transparent to radiation generated by the light generating structure 12.

FIG. 3 shows a band diagram for an illustrative light emitting heterostructure 20 according to another embodiment. In heterostructure 20, a blocking layer 22 is also included adjacent to the cladding layer 14. In an embodiment, the blocking layer 22 can comprise a group III nitride material having a graded or modulated aluminum composition along a width of the blocking layer 22. In another embodiment, the blocking layer 22 can comprise a superlattice structure, which can enable an improved materials quality in the heterostructure 20. Blocking layer 22 can be configured as an electron blocking layer and/or as a cladding layer using any solution.

FIG. 4 shows a band diagram for an illustrative light emitting heterostructure 30 according to yet another embodiment. In heterostructure 30, a thickness 32 (as measured in the direction of travel for the electrons) of a first barrier 15 in the light generating structure 12 is selected to be sufficient to accelerate electrons injected into the light generating structure 12 from the n-type contact 18 to reach an energy of a polar optical phonon, $E_{OPT-PHONON}$, with respect to the energy states in the quantum wells. Furthermore, a thickness 34 of a remainder of the light generating structure 12 can be selected to be comparable to (e.g., slightly exceed) the mean free path for the emission of polar optical phonons by electrons.

Figure 5:
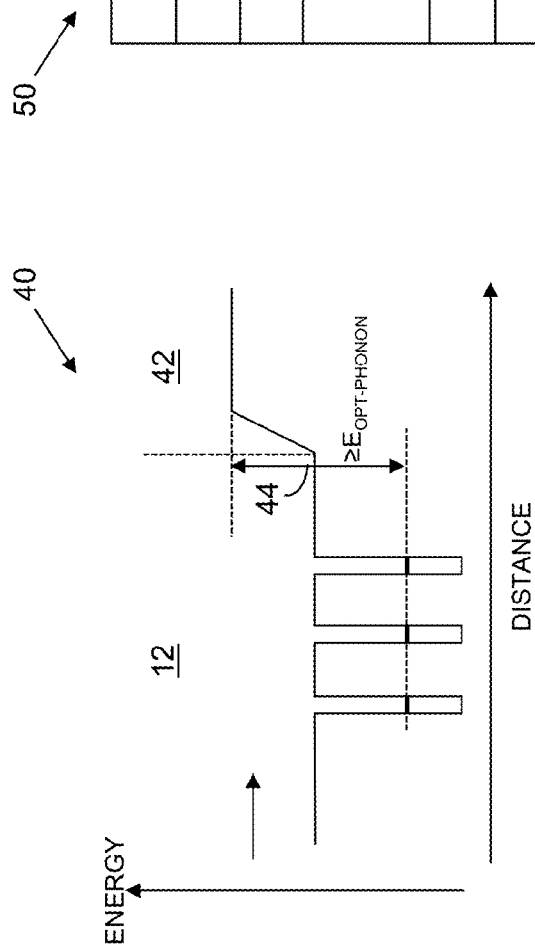
FIG. 5 shows a band diagram for an illustrative light emitting heterostructure according to still another embodiment.

FIG. 5 shows a band diagram for an illustrative light emitting heterostructure 40 according to still another embodiment. In heterostructure 40, an energy difference 44 (e.g., band offset) between an energy of a p-type blocking layer 42 and an electron ground state energy in a quantum well within the light generating structure 12 is slightly larger than the energy of the polar optical phonon, $E_{OPT-PHONON}$, in the material of the light generating structure 12. In an embodiment, the energy difference exceeds the energy of the polar optical phonon by approximately thermal energy. Blocking layer 42 can be configured as an electron blocking layer and/or as a cladding layer using any solution.

Figure 6:
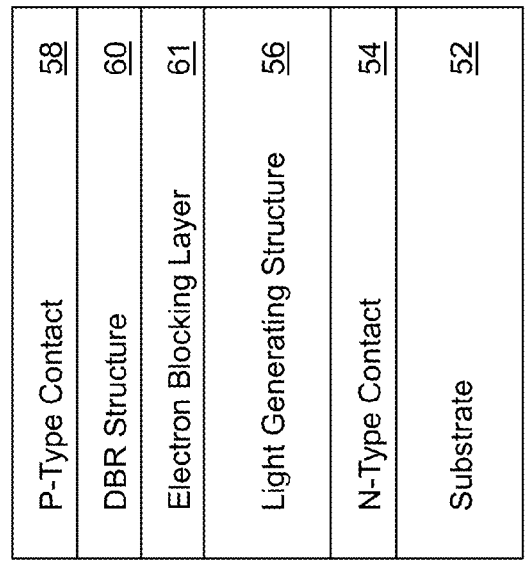
FIG. 6 shows an illustrative heterostructure for a light emitting diode according to an embodiment.

FIG. 6 shows an illustrative heterostructure 50 for a light emitting diode (LED) according to an embodiment. As illustrated, the heterostructure 50 can include a substrate 52, an n-type contact 54, a light generating structure 56, and a p-type contact 58. In an embodiment, the substrate 52 and n-type contact 54 are at least partially transparent to the light generated by the light generating structure 56, thereby enabling extraction of light generated by the light generating structure 56 out of the heterostructure 50 through the transparent substrate 52. Furthermore, the heterostructure 50 can include a distributed semiconductor heterostructure Bragg reflector (DBR) structure 60 on an opposing side of the light generating structure 56 than a transparent side of the heterostructure 50 (e.g., the transparent substrate 52). The DBR structure 60 can be configured to reflect additional light generated by the light generating structure 56 out of the transparent substrate 52 than would otherwise be provided. Additionally, the heterostructure 50 can include an electron blocking layer 61 located between the DBR structure 60 and the light generating structure 56, which can suppress residual electron overflow from the n-type contact 54 to the p-type contact 58 without capture into the light generating structure 56. The electron blocking layer 61 can be configured to be at least partially transparent to the light generated by the light generating structure 56.

The various components of the heterostructure 50 can be formed from any suitable materials, such as group III nitride materials as described herein. In an embodiment, the n-type contact 54 is formed of a short period superlattice that is at least partially transparent to radiation generated by the light generating structure 56, which can provide a higher free hole concentration due to better dopant ionization, better crystal quality, and/or higher optical transmission to the emitted radiation. In a further embodiment, the n-type contact 54 (e.g., the short period superlattice) is formed of group III nitride materials.

It is understood that additional layer(s) and/or structure(s) can be included in heterostructure 50. For example, the heterostructure 50 can include a reflective layer, a photonic crystal, a mirror, and/or the like. These layer(s) and/or structure(s) can be configured to direct light generated by the light generating structure 56 in a manner that increases an amount of light emitted from heterostructure 50 than would be emitted without the presence of the additional layer(s) and/or structures. Similarly, one or more additional layers can be located between any of the layers shown in FIG. 6. For example, a buffer layer and/or a second layer can be formed directly on the substrate 52, and the n-type contact 54 can be formed directly on the second layer.

In an embodiment, a heterostructure can include a light generating structure 56 located between a DBR structure 60 and a reflector, such as a metal reflector. In this case, the DBR structure 60 and the reflector (e.g. a reflective contact) can establish resonant optical field distribution, which can enhance an efficiency of light extraction from the heterostructure. The reflector can be formed of any type of material, which is at least partially reflective of the light generated by the light generating structure 56. In an embodiment, the material of the reflector is selected according to its reflectivity of a range of ultraviolet light including a wavelength corresponding to the peak wavelength of ultraviolet light emitted by the light generating structure 56.

Figure 7:
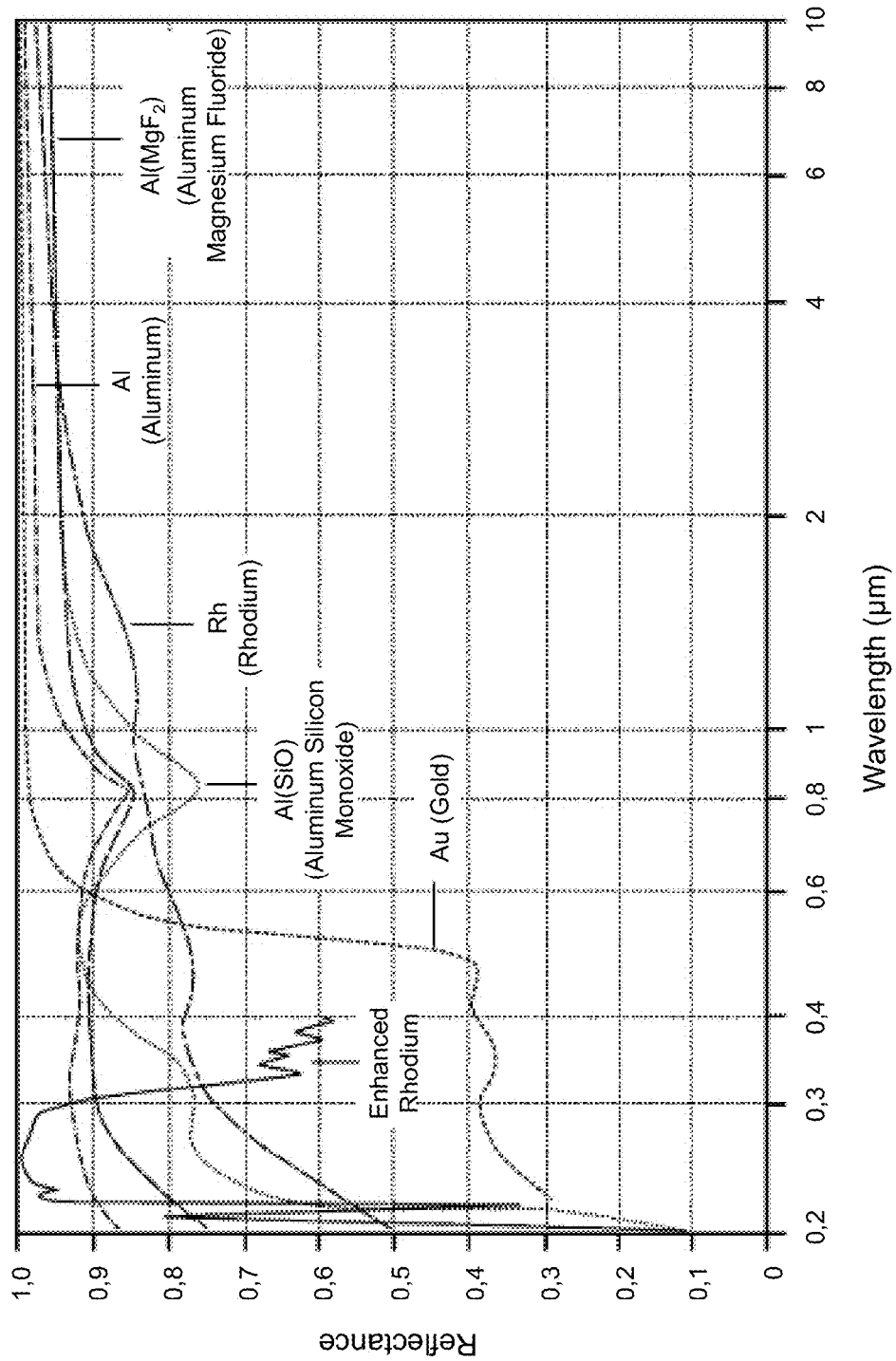
FIG. 7 shows reflection coefficients of different coatings for illustrative reflective contacts.

To this extent, FIG. 7 shows reflection coefficients of different coatings for illustrative reflective contacts. Illustrative reflective contacts can be formed from, among other things, aluminum, enhanced aluminum, aluminum silicon monoxide, aluminum magnesium fluoride, rhodium, enhanced rhodium, gold, and/or the like. As can be seen in FIG. 7, rhodium and enhanced rhodium provide good reflectivity within the ultraviolet range of wavelengths, particularly when compared to gold. In particular, enhanced rhodium provides excellent reflectivity in the deep ultraviolet range of wavelengths (e.g., wavelengths below approximately 0.3 micrometers (μm). However, rhodium does not provide good ohmic contact to AlGaN materials.

In an embodiment, a light emitting diode, such as a deep ultraviolet light emitting diode, includes a composite reflecting contact. For example, FIG. 8A shows an illustrative configuration for an LED 62, which includes a composite contact 63 comprising a thin (e.g., 2-5 nanometers thick) layer 64 of a first metal adjacent to a layer 66 of rhodium and/or enhanced rhodium. Layer 64 can be formed of any metal, which is at least partially transparent to light generated by a light emitting heterostructure 68 at the corresponding thickness of the layer 64 and which provides improved ohmic contact and/or adhesion of the thicker reflective layer 66 to the surface of the heterostructure 68, such as a heterostructure formed of group III nitride materials. In an embodiment, layer 64 is formed of nickel (Ni). However, it is understood that layer 64 can be formed of any suitable material, including Nickel oxyhydroxide (NiOx), Palladium (Pd), Molybdenum (Mo), Cobalt (Co), and/or the like.

Various alternative composite contact configurations are possible. For example, FIG. 8B shows an illustrative configuration for an LED 70 including a composite contact 72 formed of multiple layers of metals 74A-74F (e.g., a metallic superlattice), each of which can be at least partially transparent or reflective of light emitted by a corresponding light emitting heterostructure 76, such as a heterostructure formed of group-III nitride materials, of the LED 70. In an embodiment, each of the layers of metals 74A-74F is configured to be at least partially transparent to the light emitted by the light emitting heterostructure 76. For example, the layers of metals 74A-74F can include alternating thin (e.g., 2-5 nanometers thick) layers of two metals selected from: Ni, NiOx, Pd, Mo, Co, and/or the like, which can be oxidized in an $O_2$ ambient. Use of the multiple layers of metals 74A-74F can enable improved reflectivity/transparency and/or polarization control of the radiation reflected by/passing through the composite contact 72. While the composite contact 72 is shown including three repeating sets of two metals each, it is understood that the composite contact 72 can include any combination of two or more metals and any number of layers.

In another embodiment, a composite contact can include graphene. For example, layer 64 of composite contact 63 (FIG. 8A) and/or a set of layers 74A-74F of composite contact 72 can be formed of graphene, which can be configured to be transparent to light generated by the corresponding heterostructure and very conductive. Another layer, such as layer 66 of composite contact 63 and/or interlaced layers of composite contact 72, can comprise a thin layer of metal adjacent to the graphene, which can improve current spreading in the composite contact 63, 72. In a further embodiment, the composite contact 63, 73 is at least partially transparent to the light generated by the heterostructure. It is understood that an LED can include one or more layers adjacent to a contact formed of graphene, which are configured to improve light extraction from the LED, e.g., via a textured surface.

Figure 8C:
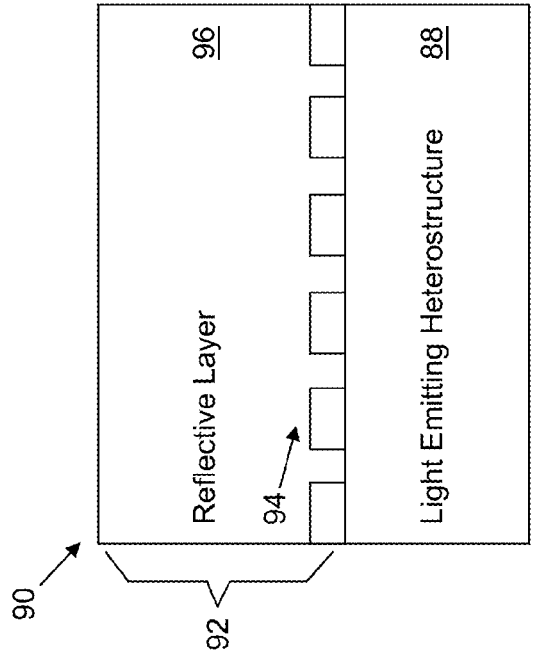

Furthermore, a composite contact of the light emitting diode can include one or more non-uniform layers. For example, a non-uniform layer can comprise a varying thickness and/or be absent from certain regions. FIG. 8C shows an illustrative configuration for an LED 80, which includes a composite contact 82 formed of a non-uniform transparent adhesion layer 84 and a reflective layer 86. In an embodiment, the non-uniform transparent adhesion layer 84 comprises nickel, the reflective layer 86 comprises enhanced rhodium, and the light emitting heterostructure 88 comprises a group III nitride heterostructure, which emits ultraviolet radiation, such as deep ultraviolet radiation. In this case, the ultraviolet radiation emitted by the light emitting heterostructure 88 will not be partially absorbed by the transparent adhesion layer 84 in the regions in which it is absent, thereby allowing for direct reflection of the ultraviolet radiation by the reflective layer 86.

Additionally, the non-uniform distribution of the transparent adhesion layer 84 can result in a non-uniform current, which is mostly limited to the areas where the transparent adhesion layer 84 improves adhesion with the surface of the light emitting heterostructure 88. As a result, a current density in these regions is higher than that for a uniform adhesion layer, which can thereby enhance radiative recombination. However, the configuration of the non-uniform transparent adhesion layer 84 can be configured to limit the current non-uniformity to a range that will not result in local overheating within the LED 80, which could result in reliability problems for the LED 80.

Figure 8D:
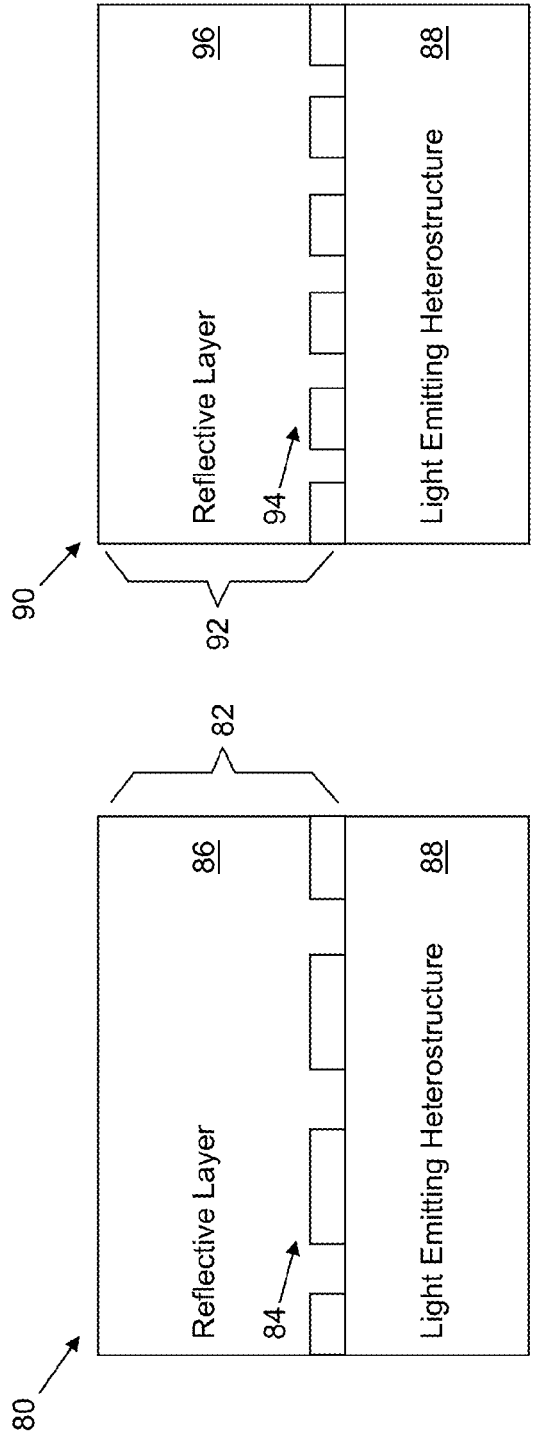

A non-uniform transparent adhesion layer 84 can comprise any type of distribution along the surface of a light emitting heterostructure 88. For example, FIG. 8D shows an illustrative configuration for an LED 90, which includes a composite contact 92 formed of a non-uniform transparent adhesion layer 94 and a reflective layer 96. In an embodiment, the non-uniform transparent adhesion layer 94 comprises nickel, while the reflective layer 96 comprises enhanced rhodium, and the light emitting heterostructure 88 comprises a group III nitride heterostructure, which emits ultraviolet radiation, such as deep ultraviolet radiation. In this case, the transparent adhesion layer 94 is periodic, thereby forming a reflecting photonic crystal. Formation of the reflecting photonic crystal can improve the light reflection of the composite contact 92, and therefore the corresponding light extraction of light from the LED 90.

Sample transparent DUV LEDs were fabricated according to embodiments, along with conventional DUV LEDs for comparison. The DUV LEDs were configured to emit radiation having a peak emission wavelength within or close to the deep ultraviolet range. Each of the transparent DUV LEDs included a transparent Mg-doped AlGaN/AlGaN short period superlattice structure (SPSL) as a cladding layer, which replaced transparent graded p-type AlGaN cladding and p-type GaN contact layers of a typical LED. The DUV LED structures were grown on a sapphire substrate by a combination of metal-organic chemical vapor deposition (MOCVD) and migration enhanced MOCVD. Each of the DUV LEDs included a thin $p^{++}$-GaN contact layer to create a polarization induced high free hole concentration near the surface and to improve the p-type contact. 300 Kelvin (K) (e.g., room temperature) and 77 K Hall measurements for the DUV LEDs were taken, and indicated free hole concentration of $9.8 \times 10^{17}$ $cm^{-3}$ and $9.6 \times 10^{17}$ $cm^{-3}$, respectively, which is consistent with the formation of a 2-dimensional (2D) hole gas. The measured hole mobility increased from 7.6 $cm^2/V \cdot s$ at 300 K to 11 $cm^2/V \cdot s$ at 77 K.

Figure 9:
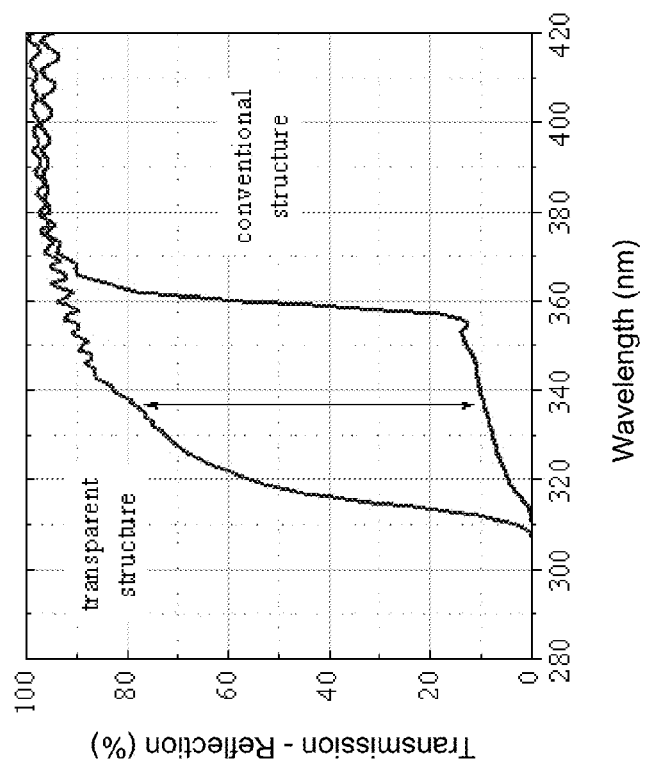
FIG. 9 shows a chart comparing illustrative transmission spectra of conventional and transparent 340 nanometer DUV LEDs structures.

Optical transmission measurements of the DUV LEDs indicated up to approximately eighty percent transmission at the peak LED emission wavelength for the respective DUV LEDs. Furthermore, the Al-based and Rh-based reflecting contacts provided more than sixty percent reflectivity within the deep ultraviolet range. FIG. 9 shows a chart comparing illustrative transmission spectra of conventional and transparent 340 nanometer DUV LEDs structures.

Figure 10:
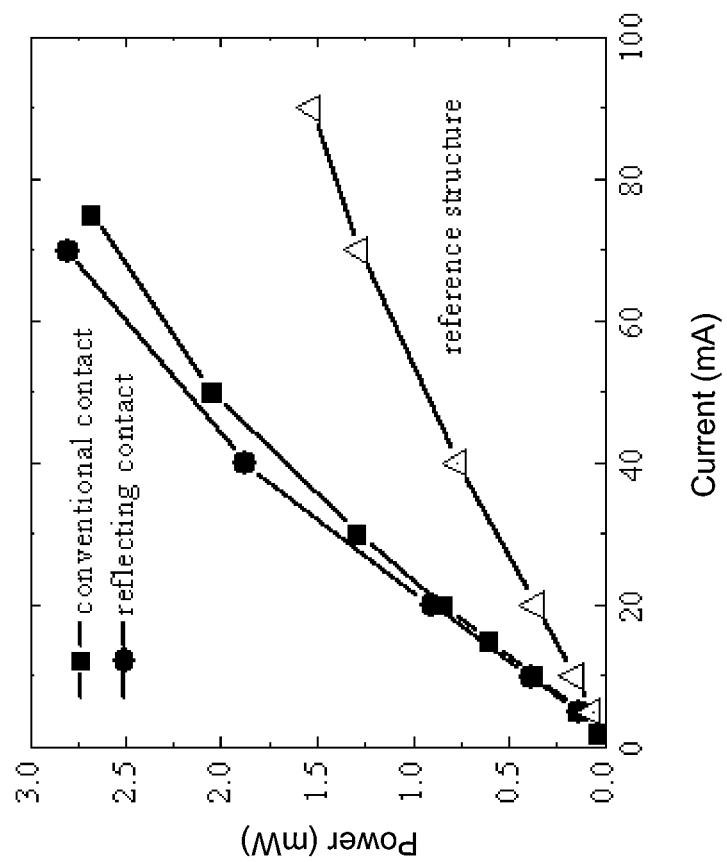
FIG. 10 shows a chart illustrating an illustrative performance improvement of a 340 nm DUV LED structure with a reflecting contact.

The forward voltage ($V_f$) of 340 nm DUV LEDs with conventional Ni/Au p-type contacts and absorbing and transparent p-type cladding layers was measured to be 5.2 Volts (V) and 6.1 V at 20 mA, respectively. Use of a reflecting p-type contact resulted in an additional approximately 0.1-0.2 V increase of $V_f$ due to the voltage drop across the contact barrier. For shorter emission wavelengths, the voltage drop across SPSL caused an increase in $V_f$ from 5.3 V to 6.4 V. The output power of transparent structure 330-340 nm emission LEDs with conventional and reflecting p-contacts were measured to be 0.83 mW and 0.91 mW at 20 mA, respectively. Devices from the reference wafer showed 0.36 mW at the same current. Testing of 310 nm DUV LEDs before packaging showed a similar increase in the DUV LED efficiency. To this extent, FIG. 10 shows a chart illustrating an illustrative performance improvement of a 340 nm DUV LED structure with a reflecting contact.

Figure 11:
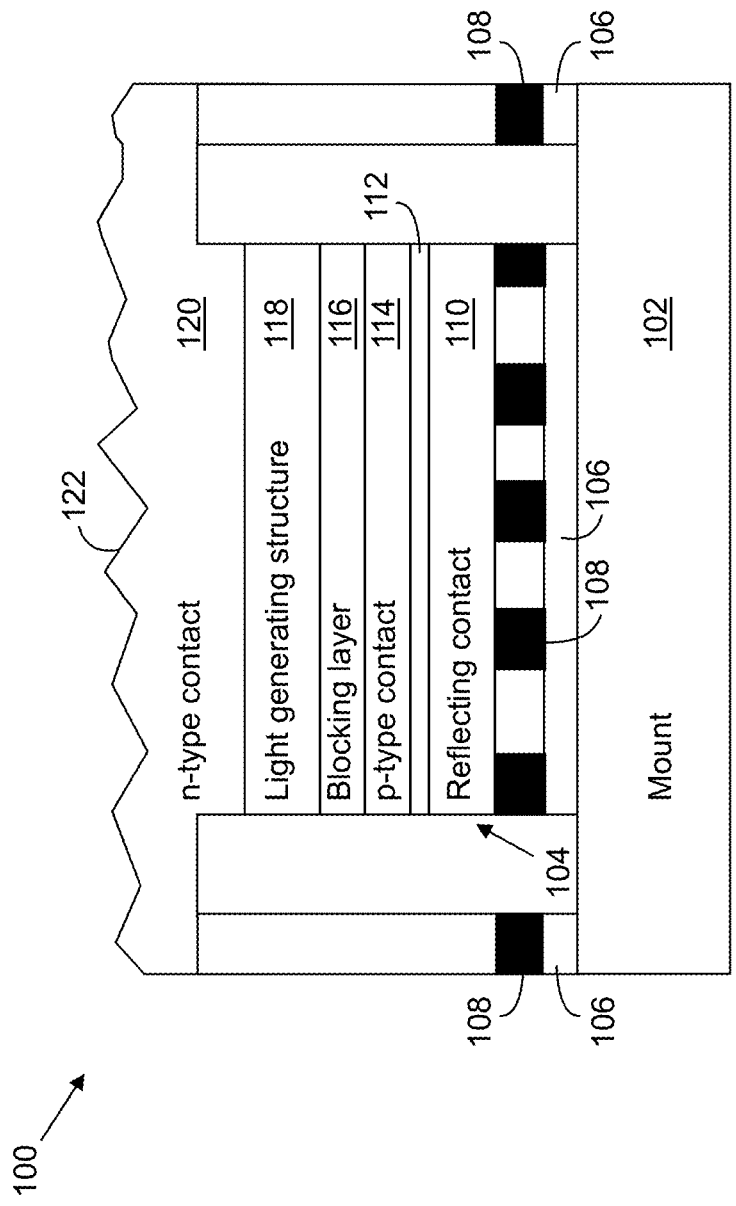
FIG. 11 shows an illustrative configuration for a flip chip LED according to an embodiment.

The heterostructure and/or contact designs described herein can be utilized in the formation of a device using a flip chip configuration. For example, FIG. 11 shows an illustrative configuration for a flip chip LED 100 according to an embodiment. In an embodiment, LED 100 can comprise a deep ultraviolet LED, which is configured to emit radiation in the deep ultraviolet range of wavelengths. LED 100 can include a mount 102, which is attached to a device heterostructure 104 using a set of bonding pads 106 and a set of solder bumps 108.

In an embodiment, the mount 102 is configured to provide protection for the heterostructure 104 from transient voltage surges, such as those caused by electrostatic discharge (ESD), an electric power surge, and/or the like. In a more particular embodiment, the mount 102 is formed of a slightly conductive material, which provides a parallel leakage path for the device heterostructure 104. For example, the conductive material can comprise a semi-insulating silicon carbide (SiC), which can comprise any of various polytypes of SiC, such as 4H—SiC, 6H—SiC, 3C—SiC, high purity SiC, and/or the like. However, it is understood that the mount 102 can comprise other types of conductive materials and/or ESD protective configurations.

As illustrated, the device heterostructure 104 can include, for example, a reflecting contact 110, a transparent adhesion layer 112 (which can be uniform or non-uniform as described herein), a p-type contact 114, a blocking layer 116, a light generating structure 118, and a n-type contact 120. Each of the components of the heterostructure 104 can be fabricated as described herein. During operation of the LED 100, the reflecting contact 110 can reflect light, such as ultraviolet light, emitted by the light generating structure 118 towards the n-type contact 120. The n-type contact 120 can be at least partially transparent to the light, thereby emitting the light from the LED 100. In an embodiment, the n-type contact 120 can comprise a textured surface 122, which is configured to improve extraction of the light from the LED 100.

The various heterostructures shown and described herein can be implemented as part of various types of devices, such as a light emitting diode (LED), a superluminescent diode, a laser, and/or the like. In an embodiment, the device is configured to emit ultraviolet radiation during operation (e.g., an ultraviolet LED, an ultraviolet superluminescent LED, and/or the like). In a more particular embodiment, the ultraviolet radiation comprises deep ultraviolet radiation, e.g., 210 nm to 365 nm.

As used herein, a layer is at least partially transparent when the layer allows at least a portion of light in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by a light generating structure described herein (e.g., peak emission wavelength +/−five nanometers). As used herein, a layer is at least partially transparent to radiation if it allows more than approximately 0.001 percent of the radiation to pass there through. In a more particular embodiment, an at least partially transparent layer is configured to allow more than approximately five percent of the radiation to pass there through. Similarly, a layer is at least partially reflective when the layer reflects at least a portion of the relevant light (e.g., light having wavelengths close to the peak emission of the light generating structure). In an embodiment, an at least partially reflective layer is configured to reflect more than approximately five percent of the radiation.

In an embodiment, a structure described herein can include one or more layers having a composition selected such that the layer has a transparency of at least a target transparency to radiation, such as ultraviolet radiation, of a target set of wavelengths. For example, a layer can be a group III nitride-based layer, such as an electron blocking layer or a p-type contact layer described herein, which is composed of $Al_xGa_{1-x}N$ where the aluminum molar fraction (x) is sufficiently high in some domains of the layer to result in the layer being at least partially transparent to ultraviolet radiation. In an embodiment, the layer can comprise a superlattice layer located in an emitting device configured to emit radiation having a dominant wavelength in the ultraviolet spectrum, and the composition of at least one sub-layer in each period of the superlattice layer is configured to be at least partially transparent to ultraviolet radiation having a target wavelength corresponding to the ultraviolet radiation emitted by the emitting device.

An amount of transparency of a short period superlattice (SPSL) can be approximated by computing an averaged band gap of the SPSL, and deducing average absorption coefficients of the SPSL. The absorption coefficients depend on an absorption edge of the semiconductor material, which for materials formed of an AlGaN alloy, is a function of the molar fractions of the $Al_xGa_{1-x}N$ semiconductor alloy.

In an embodiment, the target transparency for the material is at least ten times more transparent than the least transparent layer of material in the structure (e.g., GaN for a group III nitride-based device). In this case, an absorption coefficient of the semiconductor layer can be on the order of $10^4$ inverse centimeters or lower. In this case, a one micron thick semiconductor layer will allow approximately thirty-six percent of the ultraviolet radiation to pass there through.

Figure 12:
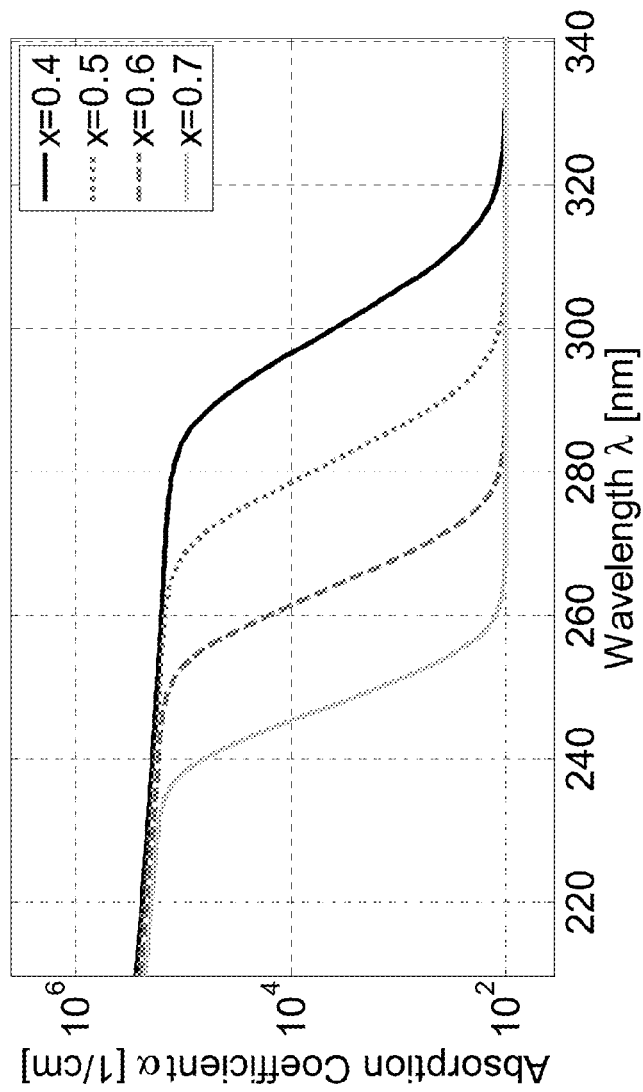
FIG. 12 shows a dependence of the absorption coefficient on the wavelength for various aluminum molar fractions (x) of an $Al_xGa_{1-x}N$ alloy according to an embodiment.
Figure 13:
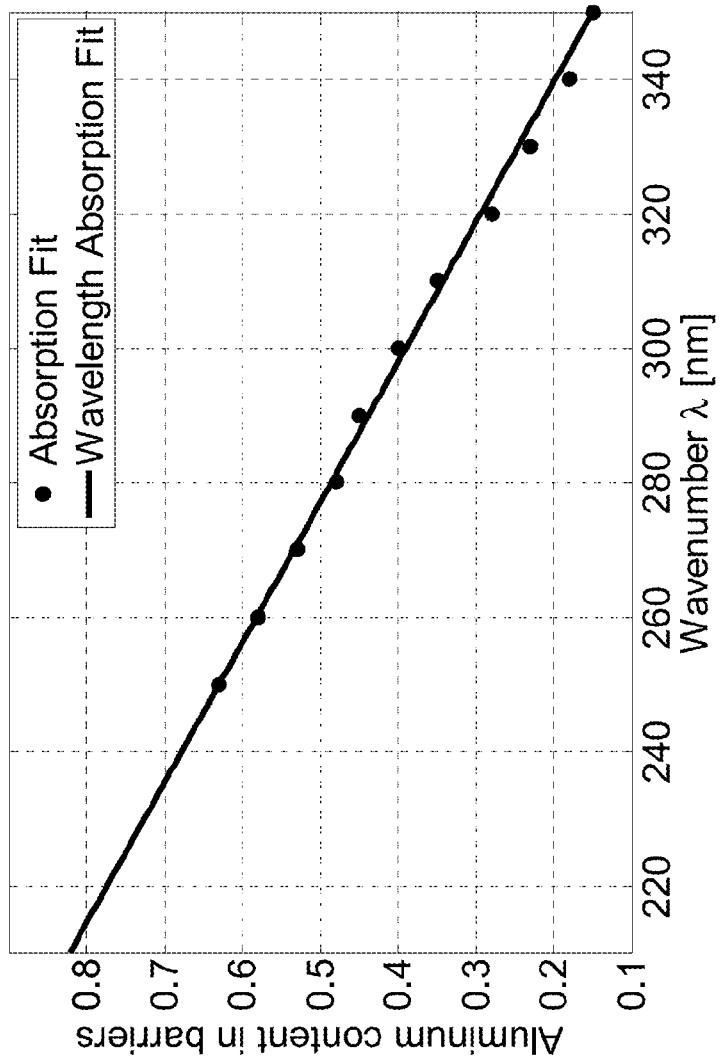
FIG. 13 shows an illustrative chart for selecting an aluminum content of an AlGaN alloy to maintain a target transparency for a corresponding emitted wavelength according to an embodiment.

FIG. 12 shows a dependence of the absorption coefficient on the wavelength for various aluminum molar fractions (x) of an $Al_xGa_{1-x}N$ alloy according to an embodiment. In order to maintain an absorption coefficient of the semiconductor layer at orders of $10^4$ inverse centimeters or lower, the content of aluminum in an SPSL barrier layer can be chosen based on the corresponding target wavelength or range of wavelengths. For example, for a target wavelength of approximately 250 nanometers, the aluminum molar fraction can be approximately 0.7 or higher, whereas for a target wavelength of approximately 300 nanometers, the aluminum molar fraction can be as low as approximately 0.4. FIG. 13 shows an illustrative chart for selecting an aluminum content of an $Al_xGa_{1-x}N$ alloy to maintain a target transparency for a corresponding emitted wavelength, $\lambda$, according to an embodiment. In this case, the target transparency corresponds to an absorption coefficient of the semiconductor layer on the order of $10^4$ inverse centimeters. Note that in FIG. 13, the dependence of $x=x(\lambda)$ is linear, with $x=C\cdot\lambda+B$, where $C=-0.0048$ [1/nm], and $B=1.83$.

In an embodiment, a device can include one or more layers with lateral regions configured to facilitate the transmission of radiation through the layer and lateral regions configured to facilitate current flow through the layer. For example, the layer can be a short period superlattice, which includes barriers alternating with wells. In this case, the barriers can include both transparent regions, which are configured to reduce an amount of radiation that is absorbed in the layer, and higher conductive regions, which are configured to keep the voltage drop across the layer within a desired range. As used herein, the term lateral means the plane of the layer that is substantially parallel with the surface of the layer adjacent to another layer of the device. As described herein, the lateral cross section of the layer can include a set of transparent regions, which correspond to those regions having a relatively high aluminum content, and a set of higher conductive regions, which correspond to those regions having a relatively low aluminum content.

The set of transparent regions can be configured to allow a significant amount of the radiation to pass through the layer, while the set of higher conductive regions can be configured to keep the voltage drop across the layer within a desired range (e.g., less than ten percent of a total voltage drop across the structure). In an embodiment, the set of transparent regions occupy at least ten percent of the lateral area of the layer, while the set of higher conductive regions occupy at least approximately two percent (five percent in a more specific embodiment) of the lateral area of the layer. Furthermore, in an embodiment, a band gap of the higher conductive regions is at least five percent smaller than the band gap of the transparent regions. In a more particular embodiment, the transparent regions comprise a transmission coefficient for radiation of a target wavelength higher than approximately sixty percent (eighty percent in a still more particular embodiment), while the higher conductive regions have a resistance per unit area to vertical current flow that is smaller than approximately $10^{-2}$ ohm·cm$^2$. As used herein, the term transmission coefficient means the ratio of an amount of radiation exiting the region to an amount of radiation entering the region.

The transparent and conductive regions can be formed using any solution. For example, a layer can be grown using migration-enhanced metalorganic chemical vapor deposition (MEMOCVD). During the growth, inhomogeneities in the lateral direction of a molar fraction of one or more elements, such as aluminum, gallium, indium, boron, and/or the like, can be allowed in the layer. In an embodiment, such compositional inhomogeneities can vary by at least one percent.

While shown and described herein as a method of designing and/or fabricating a structure and/or a corresponding semiconductor device including the structure, it is understood that aspects of the invention further provide various alternative embodiments. For example, in one embodiment, the invention provides a method of designing and/or fabricating a circuit that includes one or more of the devices designed and fabricated as described herein.

Figure 14:
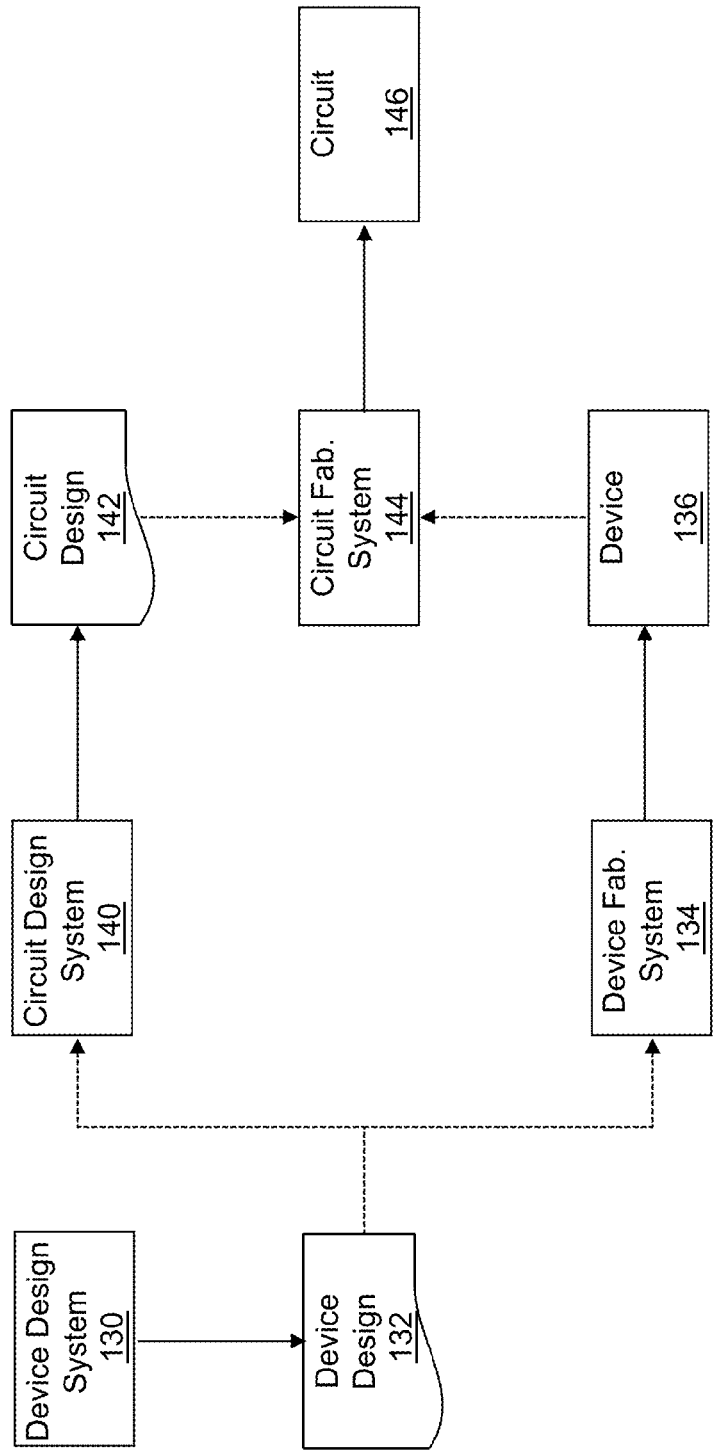
FIG. 14 shows an illustrative flow diagram for fabricating a circuit according to an embodiment.

To this extent, FIG. 14 shows an illustrative flow diagram for fabricating a circuit 146 according to an embodiment. Initially, a user can utilize a device design system 130 to generate a device design 132 using a method described herein. The device design 132 can comprise program code, which can be used by a device fabrication system 134 to generate a set of physical devices 136 according to the features defined by the device design 132. Similarly, the device design 132 can be provided to a circuit design system 140 (e.g., as an available component for use in circuits), which a user can utilize to generate a circuit design 142 (e.g., by connecting one or more inputs and outputs to various devices included in a circuit). The circuit design 142 can comprise program code that includes a device designed using a method described herein. In any event, the circuit design 142 and/or one or more physical devices 136 can be provided to a circuit fabrication system 144, which can generate a physical circuit 146 according to the circuit design 142. The physical circuit 146 can include one or more devices 136 designed using a method described herein.

In another embodiment, the invention provides a device design system 130 for designing and/or a device fabrication system 134 for fabricating a semiconductor device 136 using a method described herein. In this case, the system 130, 134 can comprise a general purpose computing device, which is programmed to implement a method of designing and/or fabricating the semiconductor device 136 as described herein. Similarly, an embodiment of the invention provides a circuit design system 140 for designing and/or a circuit fabrication system 144 for fabricating a circuit 146 that includes at least one device 136 designed and/or fabricated using a method described herein. In this case, the system 140, 144 can comprise a general purpose computing device, which is programmed to implement a method of designing and/or fabricating the circuit 146 including at least one semiconductor device 136 as described herein.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a light emitting heterostructure, the method comprising:
creating a design for the light emitting heterostructure based on a set of attributes of a polar optical phonon, wherein the light emitting heterostructure includes an n-type contact layer and a light generating structure including a plurality of quantum wells and having a first side adjacent to the n-type contact layer, and wherein the creating includes:
selecting materials for the n-type contact layer and a quantum well in the plurality of quantum wells based on an energy of the polar optical phonon in a material of the light generating structure, wherein a difference between a conduction band edge energy of the n-type contact layer and an electron ground state energy of the quantum well is greater than the energy of the polar optical phonon; and
selecting a target width of the light generating structure based on a mean free path for emission of a polar optical phonon by an electron injected into the light generating structure, wherein the target width is comparable to the mean free path; and
fabricating the light emitting heterostructure according to the design.

2. The method of claim 1, wherein the difference exceeds the energy of the polar optical phonon by approximately thermal energy.

3. The method of claim 1, wherein the target width exceeds the mean free path by less than approximately ten percent.

4. The method of claim 1, the creating further including selecting a material for a blocking layer located on an opposite side to the first side of the light generating structure based on the energy of the polar optical phonon, wherein a difference between a conduction band edge energy of the blocking layer and the electron ground state energy of a quantum well in the plurality of quantum wells is greater than the energy of the polar optical phonon.

5. The method of claim 1, wherein the design for the light emitting heterostructure further includes a set of barriers interlaced with the plurality of quantum wells, the set of barriers including a first barrier immediately adjacent to a first quantum well in the plurality of quantum wells and the first side of the light generating structure, wherein the creating further includes selecting a target thickness of the first barrier to be sufficient to accelerate an injected electron in an electric field to reach the energy of the polar optical phonon with respect to the electron ground state energy in the first quantum well, and wherein a thickness of a remainder of the light generating structure exceeds the mean free path for emission of the polar optical phonon.

6. The method of claim 1, wherein the design for the light emitting heterostructure further includes:
   an at least partially transparent substrate, wherein the n-type contact layer is located between the substrate and the light generating structure, and wherein the at least partially transparent substrate and the n-type contact layer are at least partially transparent to the light generated by the light generating structure; and
   a Bragg reflector structure located on an opposing side to the first side of the light generating structure, wherein the Bragg reflector structure is configured to reflect light generated by the light generating structure towards the substrate.

7. The method of claim 6, wherein the design for the light emitting heterostructure further includes an electron blocking layer formed between the light generating structure and the Bragg reflector structure.

8. The method of claim 6, wherein the n-type contact comprises a short period superlattice.

9. The method of claim 1, wherein the design for the light emitting heterostructure further includes a composite contact located on an opposite side to the first side of the light generating structure, the composite contact comprising:
   an adhesion layer, wherein the adhesion layer is at least partially transparent to light generated by the light generating structure; and
   a reflecting metal layer configured to reflect at least a portion of the light generated by the light generating structure.

10. The method of claim 9, wherein the adhesion layer comprises a thin layer of one of: nickel, palladium, molybdenum, or cobalt, and wherein the reflecting metal layer comprises one of: aluminum, enhanced aluminum, rhodium, or enhanced rhodium.

11. The method of claim 9, wherein the adhesion layer comprises a non-uniform layer.

12. The method of claim 11, wherein the non-uniform adhesion layer is configured to form a photonic crystal.

13. The method of claim 9, wherein the design for the light emitting heterostructure further includes a distributed semiconductor heterostructure Bragg reflector (DBR) structure, wherein the DBR structure is located on an opposing side of the light generating structure as the composite contact.

14. The method of claim 1, wherein the design for the light emitting heterostructure further includes a composite contact located on an opposite side to the first side of the light generating structure, wherein at least one layer of the composite contact is formed of graphene.

15. The method of claim 1, wherein the design for the light emitting heterostructure further includes a metallic superlattice contact located on an opposite side to the first side of the light generating structure, wherein the metallic superlattice includes a plurality of intertwined layers of a first metal and a second metal distinct from the first metal, and wherein the metallic superlattice is at least partially transparent to light generated by the light generating structure.

16. The method of claim 1, wherein the design for the light emitting heterostructure further includes a superlattice layer adjacent to an opposite side to the first side of the light generating structure, wherein the superlattice layer includes:
   a first sub-layer having a first group III nitride composition, wherein the first group III nitride composition is selected such that the first sub-layer has a transparency of at least a target transparency to ultraviolet radiation of a target wavelength; and
   a second sub-layer adjacent to the first sub-layer, the second sub-layer having a second group III nitride composition distinct from the first group III nitride composition.

17. The method of claim 16, wherein the first group III nitride composition includes aluminum, and the creating further includes selecting a molar fraction of aluminum in the first group III nitride composition based on the target transparency to ultraviolet radiation of the target wavelength.

18. The method of claim 17, wherein the first group III nitride composition is an $Al_xGa_{1-x}N$ alloy, and the creating further includes selecting an aluminum molar fraction x using the formula $C \cdot \lambda + B$, where $C = -0.0048$ nm$-1$, $B = 1.83$, and $\lambda$ is the target wavelength of the ultraviolet radiation.

19. The method of claim 16, the creating further including varying a target composition of the first sub-layer along lateral dimensions of the first sub-layer such that a lateral cross section of the first sub-layer includes:
   a set of transparent regions, each transparent region having a transmission coefficient for the target wavelength greater than or equal to approximately sixty percent, wherein the set of transparent regions are at least ten percent of an area of the lateral cross section of the first sub-layer; and
   a set of higher conductive regions occupying a sufficient area of the area of the lateral cross section of the first sub-layer and having an average resistance per unit area to a vertical current flow resulting in a total voltage drop across the superlattice layer of less than ten percent of a total voltage drop across the structure.

20. The method of claim 19, wherein each of the set of higher conductive regions comprises a molar fraction of aluminum providing a band gap at least five percent smaller than a band gap of the set of transparent regions.

21. A method of fabricating a light emitting heterostructure, the method comprising:
   creating a design for the light emitting heterostructure based on a set of attributes of a polar optical phonon, wherein the light emitting heterostructure includes an n-type contact layer, a light generating structure including a plurality of quantum wells and having a first side adjacent to the n-type contact layer, and a blocking layer located on a second side of the light generating structure opposite the first side, and wherein the creating includes:

selecting materials for the blocking layer and a quantum well in the plurality of quantum wells based on an energy of the polar optical phonon in a material of the light generating structure, wherein a difference between a conduction band edge energy of the blocking layer and an electron ground state energy of the quantum well is greater than the energy of the polar optical phonon; and selecting a target width of the light generating structure based on a mean free path for emission of a polar optical phonon by an electron injected into the light generating structure, wherein the target width is comparable to the mean free path; and fabricating the light emitting heterostructure according to the design.

22. The method of claim 21, wherein the target width exceeds the mean free path by less than approximately ten percent.

23. The method of claim 21, wherein the design for the light emitting heterostructure further includes a set of barriers interlaced with the plurality of quantum wells, the set of barriers including a first barrier immediately adjacent to a first quantum well in the plurality of quantum wells and the first side of the light generating structure, wherein the creating further includes selecting a target thickness of the first barrier to be sufficient to accelerate an injected electron in an electric field to reach the energy of the polar optical phonon with respect to the electron ground state energy in the first quantum well, and wherein a thickness of a remainder of the light generating structure exceeds the mean free path for emission of the polar optical phonon.

24. The method of claim 22, wherein the design for the light emitting heterostructure further includes a composite contact located on an opposite side to the first side of the light generating structure, the composite contact comprising:

an adhesion layer, wherein the adhesion layer is at least partially transparent to light generated by the light generating structure; and a reflecting metal layer configured to reflect at least a portion of the light generated by the light generating structure.

25. The method of claim 24, wherein the adhesion layer comprises a thin layer of one of: nickel, palladium, molybdenum, or cobalt, and wherein the reflecting metal layer comprises one of: aluminum, enhanced aluminum, rhodium, or enhanced rhodium.

26. A method of fabricating a light emitting device, the method comprising:

forming an n-type contact layer;

forming a light generating structure having a first side adjacent to the n-type contact layer, the light generating structure including:

a set of quantum wells, wherein a difference between a conduction band edge energy of the n-type contact layer and an electron ground state energy of a quantum well in the set of quantum wells is greater than an energy of a polar optical phonon in a material of the light generating structure; and a set of barriers interlaced with set of quantum wells, the set of barriers including a first barrier immediately adjacent to a first quantum well in the set of quantum wells and the first side of the light generating structure, wherein a thickness of the first barrier is sufficient to accelerate an injected electron in an electric field to reach the energy of the polar optical phonon with respect to the electron ground state energy in the first quantum well, and wherein a thickness of a remainder of the light generating structure exceeds a mean free path for emission of a polar optical phonon by an electron injected into the light generating structure.

27. The method of claim 26, further comprising forming a composite contact located on an opposite side to the first side of the light generating structure, the composite contact comprising:

an adhesion layer, wherein a material forming the adhesion layer has a maximum thickness less than five nanometers and allows at least five percent of the light generated by the light generating structure to pass there through; and a reflecting metal layer configured to reflect at least a portion of the light generated by the light generating structure.

* * * * *